United States Patent
Wark et al.

(10) Patent No.: US 6,782,613 B1
(45) Date of Patent: Aug. 31, 2004

(54) METHOD OF MAKING AN INTERPOSER WITH CONTACT STRUCTURES

(75) Inventors: James M. Wark, Boise, ID (US); Salman Akram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/631,253

(22) Filed: Aug. 2, 2000

Related U.S. Application Data (62) Division of application No. 09/058,586, filed on Apr. 10, 1998, now Pat. No. 6,299,456.

(51) Int. Cl.$^7$ .............................. H01R 9/00; H05K 3/00
(52) U.S. Cl. ............................. 29/842; 29/825; 29/830; 29/846; 216/39; 216/41; 439/65; 439/66; 439/79; 439/91; 439/591; 439/862
(58) Field of Search .......................... 29/825, 830, 846, 29/842; 439/66, 591, 65, 91, 79, 862, 912; 216/39, 41

(56) References Cited

U.S. PATENT DOCUMENTS

| | | | | |
|---|---|---|---|---|
| 4,000,054 A | * | 12/1976 | Marcantonio | 204/192 |
| 4,984,358 A | * | 1/1991 | Nelson | 29/830 |
| 4,985,107 A | | 1/1991 | Conroy et al. | 156/299 |
| 5,037,312 A | * | 8/1991 | Casciotti et al. | 439/66 |
| 5,123,849 A | * | 6/1992 | Deak et al. | 439/66 |
| 5,163,834 A | * | 11/1992 | Chapin et al. | 439/66 |
| 5,227,588 A | * | 7/1993 | Schreiber et al. | 174/262 |
| 5,307,561 A | * | 5/1994 | Feigenbaum et al. | 29/846 |
| 5,343,616 A | * | 9/1994 | Roberts | 29/846 |
| 5,483,741 A | | 1/1996 | Akram et al. | 29/846 |
| 5,541,812 A | * | 7/1996 | Burns | 361/735 |
| 5,584,120 A | * | 12/1996 | Roberts | 29/846 |
| 5,657,207 A | | 8/1997 | Schreiber et al. | 361/774 |
| 5,759,047 A | | 6/1998 | Brodsky et al. | 439/66 |
| 5,800,184 A | * | 9/1998 | Lopergolo et al. | 439/66 |
| 5,848,467 A | * | 12/1998 | Khandros et al. | 29/841 |
| 5,866,948 A | | 2/1999 | Murakami et al. | 257/778 |
| 6,004,471 A | * | 12/1999 | Chuang | 216/16 |
| 6,052,286 A | * | 4/2000 | Worthen et al. | 361/765 |
| 6,059,982 A | * | 5/2000 | Palagonia et al. | 216/11 |
| 6,133,072 A | * | 10/2000 | Fjelstad | 438/128 |

* cited by examiner

Primary Examiner—A. Dexter Tugbang
Assistant Examiner—Paul D Kim
(74) Attorney, Agent, or Firm—Workman Nydegger (57) ABSTRACT

A method of making an interposer having an array of contact structures for making temporary electrical contact with the leads of a chip package. The contact structures may make contact with the leads substantially as close as desired to the body of the chip package. Moreover, the contact structures can be adapted for making contact with leads having a very fine pitch. In a first embodiment, the contact structures include raised members formed over a body of the interposer. A conductive layer is formed over each of the raised members to provide a contact surface for engaging the leads of the chip package. In another embodiment, the raised members are replaced with depressions formed into the interposer. A conductive layer is formed on an inside surface of each depression to provide a contact surface for engaging the leads of the chip package. Moreover, any combination of raised members and depressions may be used.

17 Claims, 6 Drawing Sheets

METHOD OF MAKING AN INTERPOSER WITH CONTACT STRUCTURES

RELATED APPLICATIONS

This application is a divisional of U.S. patent application Ser. No. 09/058,586, filed Apr. 10, 1998 now U.S. Pat. No. 6,298,456, which is incorporated herein by reference.

BACKGROUND OF THE INVENTION

1. The Field of the Invention

The present invention relates to structures for electrically connecting an integrated circuit to external circuitry. More particularly, the present invention relates to interposer structures having formed thereon a plurality of conductive pillars or recesses that are adapted to make electrical contact with the leads of an integrated circuit package.

2. The Relevant Technology

Frequently, after an integrated circuit is manufactured, a testing process is conducted on the integrated circuit by subjecting it to a preselected set of input conditions in order to measure its response or other parameters. Such testing is often conducted on a chip package that includes an integrated circuit. As used herein, the terms "integrated circuit package" and "chip package" refer to an assembly that includes an integrated circuit or another semiconductor structure in combination with external and additional structure. The term "semiconductor structure" extends to any device or assembly that includes circuitry defined in a semiconductive material, and further extends to a chip package that includes semiconductive material. The external and additional structure of a package assembly may be used, for example, for mounting the semiconductor structure to a printed circuit board or other external circuitry, for establishing electrical connection between the semiconductor structure and external circuitry, for improving the ease of handling or transporting the semiconductor structure, and/or for protecting the semiconductor structure from environmental conditions.

Many chip packages include a lead frame that extends beyond the body thereof. The lead frame typically includes an array of electrical leads that extend from the internal circuitry of the integrated circuit to the exterior portion of the chip package where they are exposed to the surroundings. Testing of an integrated circuit package that includes a lead frame assembly is conventionally conducted by providing temporary electrical communication between the leads and testing circuitry. For example, such temporary electrical connection may be established by using a set of probes, pins, sockets, or the like, to contact the leads. The integrated circuit package may be clamped or otherwise secured in position during the testing operation in order for the leads to remain in electrical contact with the corresponding probes, pins, sockets, etc., of the testing circuitry.

Regardless of which electrical connection technique is employed, it is desirable to effect a connection that causes as little damage as possible to be leads. If the temporary connection to contact surfaces damages the leads, the entire integrated circuit package may be rendered useless.

The trend in the semiconductor manufacturing industry is towards smaller devices and an increase in the number of leads connected to an integrated circuit package. This has the result of reducing the distance between nearest leads on an integrated circuit package. In particular, the pitch of leads, which is defined as the distance between corresponding points on nearest adjacent leads, has progressively grown smaller.

As the pitch of integrated circuit packages decreases, it becomes ever more difficult to effectively and reliably establish temporary electrical contact with the leads without damaging the leads. The difficulties are compounded in light of the fact that testing is generally more reliable when electrical contact is made with leads as near to the body of the integrated circuit package as possible. If contact is instead made with the leads a relatively large distance from the body of the integrated circuit package, the resulting long conductive segments of the leads can generate considerable interference and noise which may disrupt the testing procedure.

Establishing electrical connection with leads near the body of integrated circuit package is further desirable as integrated circuits operate at ever higher speeds. If electrical connection is established at a relatively great distance from the body of a high-speed integrated circuit package, signals are not able to be received and transmitted at the proper synchronization or at the proper timing, which may cause the integrated circuit to malfunction or the testing procedure to become disrupted.

It can be easily understood that the factors that encourage electrical connection to be established relatively near the body of the integrated circuit package are often in conflict with efforts for making contact with conventional fine pitch lead frames. The probes, sockets and the like that have been used in the prior art are often not able to adequately balance these considerations and increasingly are unable to provide reliable electrical connection for conducting testing procedures.

Accordingly, it can be appreciated that it would be an advancement in the art to provide an interconnect structure that can provide electrical connection with leads near the body of an integrated circuit package, particularly when the leads have a relatively fine pitch.

SUMMARY OF THE INVENTION

The present invention relates to interposer structures that include a plurality of contact structures formed thereon in a pattern that corresponds to electrical leads of an integrated circuit package. The contact structures are arrayed across a surface of the interposer structure in a position so as to make electrical connection with the leads of an integrated circuit package when the integrated circuit package is positioned thereover. The contact structures include a conductive layer for electrically engaging the leads and an electrical trace having a first end in contact with the conductive layer and an opposite second end configured to be connected with another conductive structure. For example, wire bonded leads, conductive tape or non-bonded leads may be connected with the second end of the traces. These wires or leads in turn terminate at terminal contact points that preferably have a pitch greater than the pitch of the leads of the integrated circuit package. In this manner, relatively fine pitch leads can be connected to conventional sockets or other mounting structures on a testing device that have a greater pitch by means of the interposer structure.

The interposer structures of the invention include a dielectric or a semiconductor substrate over which the contact structures may be formed. The semiconductor substrate is preferably substantially composed of silicon or a silicon containing material. Alternatively, a dielectrics substrate can be formed over a semiconductor substrate. The dielectric substrate may be disposed over a body portion of the interposer structure or may instead be an integral portion of the interposer structure.

Under a first embodiment of the invention, an array of raised members are formed on the dielectric or semiconductor substrate, with each raised member having a top surface distal to the dielectric or semiconductor substrate. A conductive layer is deposited or otherwise formed on the top surface of each of the raised members. The raised members are sized and spaced so that the conductive layers formed thereover may electrically engage the leads of an integrated circuit package. The raised members may be formed from the dielectric or semiconductor substrate using any suitable etching procedure or other micromachining operation. Silicon or silicon containing material is a preferred material for use in the dielectric or semiconductor substrate because such material is relatively easy to pattern to form the raised members, as well as being scalable to relatively smaller geometries and compared to other materials used in etching procedures or micromachining operations.

Optionally, one or more projecting apex structures are formed in top surface of the raised member, upon which is positioned the conductive layer opposite the top surface of the raised member. The projecting apex structures facilitate the establishment of ohmic contact with the leads by penetrating the surface of the leads, including any oxide layer that may have been formed thereon.

According to a second embodiment of the invention, an interposer is provided, wherein the raised members are replaced with an array of depressions formed into the dielectric or semiconductor substrate. A conductive layer is deposited or otherwise formed on an inside surface of each of the depressions. The depressions are aligned and spaced so that the leads of an integrated circuit package may be placed therein and become electrically engaged with the conductive layers. For example, the depressions may take the form of trenches, each having a longitudinal axis parallel to the longitudinal axis of the corresponding lead. The trenches or other depressions may have one end that is open into a nest or other low elevation region on the face of the interposer structure. The nest may facilitate placement of the leads into the depressions by allowing the integrated circuit package to rest low on the interposer and near to the plane defined by the array of depressions.

According to either of the foregoing embodiments, electrical traces preferably extend from the conductive layer along a surface of the body of the interposer structure. The traces preferably have a contact pad at one end thereof where a conductive structure such as a wire or conductive tape may be attached. Any suitable conductive structure may be used to electrically connect the trace with external circuitry, such as that found in a testing apparatus. For example, conductive tape may be attached to the leads to provide an electrical path to the testing device. According to a preferred configuration of the interposer structure, the conductive tape wraps around an edge of the interposer structure and extends to a face of the interposer structure opposite the contact structures. The conductive tape may end at a terminal contact point that can be connected to a conventional socket or probe. Preferably, the terminal contact points on the conductive tape are not aligned across the surface of interposer structure, but are instead staggered, thereby increasing the distance between adjacent terminal contact points and increasing the pitch.

When an integrated circuit package is electrically connected to the interposer structure, the integrated circuit package may advantageously be secured thereover in order to reliably establish electrical connection. This can be accomplished by any of a number of suitable methods. For example, a clamping apparatus may be brought into contact with the leads or with another part of the integrated circuit package. The clamping apparatus may be a bar or a plate that is pressed onto the integrated circuit package on the opposite side thereof from the interposer structure. Alternatively, a vacuum source may be connected to a via that extends through the interposer structure and terminates at an end that is adjacent a portion of the body of the integrated circuit package. Using the vacuum source, the integrated circuit package may be held onto the interposer structure by differences in air pressure. In any case, when the interposer structure is used for testing an integrated circuit, the method of securing the integrated circuit package onto the interposer structure is preferably temporary.

According to still another embodiment of the invention, the raised members and depressions of the previous embodiments are replaced with an array of conductive bumps. The interposer structure of this embodiment includes a substrate over which a plurality of segments of conductive tape are positioned. A conductive bump is deposited over each segment of conductive tape in order to provide contact surfaces for electrically engaging the leads of the integrated circuit package.

In view of the foregoing, the interposer structures of the invention are able to establish electrical connection to leads relatively near the body of an integrated circuit package. This is possible even in situations where the leads have a very fine pitch. Moreover, reliable temporary electrical contact with leads can be established without damaging the leads.

BRIEF DESCRIPTION OF THE DRAWINGS

In order that the manner in which the above-recited and other advantages and objects of the invention are obtained, a more particular description of the invention briefly described above will be rendered by reference to specific embodiments thereof which are illustrated in the appended drawings. Understanding that these drawings depict only typical embodiments of the invention and are therefore not to be considered limiting of its scope, the invention will be described with additional specificity and detail through the use of the accompanying drawings in which.

DETAILED DESCRIPTION OF THE PREFERRED EMBODIMENTS

The present invention relates to interposer structures that may be used for establishing electrical connection between an integrated circuit and external circuitry. The interposer structures are useful for making electrical contact with electrical leads of an integrated circuit package relatively near the body of the integrated circuit package. The interposer structures include an array of contact structures that are sized and spaced so as to correspond to the leads of the integrated circuit package. The contact structures may be formed on the interposer with a pitch small enough to accommodate the leads of substantially any integrated circuit.

The interposers of the invention provide electrical paths from the contact structures to terminal contact points that may have a pitch greater than the pitch of the leads. Accordingly, the interposers may be used to connect an integrated circuit having relatively fine pitch with a conventional socket assembly that has a larger pitch. According to the invention, the contact structures may take any of a number of forms, including, but not limited to, raised members formed over a substrate, depressions formed into the substrate, conductive bumps formed over conductive tape, and combinations of the foregoing.

Figure 1:
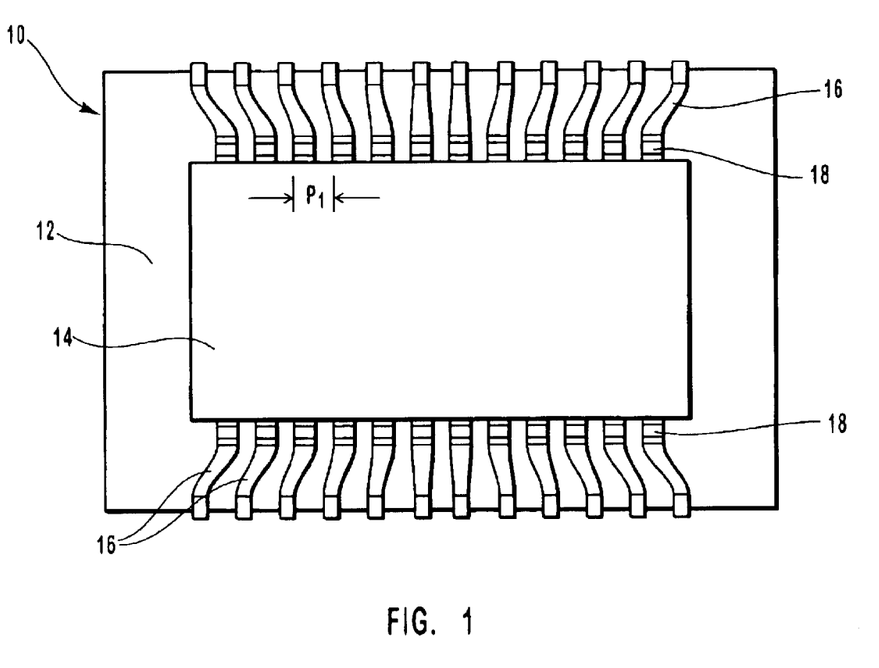
FIG. 1 is a top view of an interposer structure including an array of contact structures according to a first embodiment of the invention.

FIG. 1 illustrates an interposer 10 according to the invention. Interposer 10 preferably includes a body 12 on which other portions of interposer 10 are formed. Preferably, body 12 is formed by etching a material, such as silicon. The etching process stops once body 12 assumes a desired shape. Then, a dielectric material is formed thereon so as to isolate, one from another, the discrete conductive components that are formed by the etching process. Silicon is a preferred material for body 12 because of the relative ease at which it may be etched or otherwise micromachined. Alternatively, body 12 may be composed of other materials, including, but not limited to, ceramics, polymers, composites, and the like. Preferably, body 12 is formed from a material that is rigid enough to resist significant bending and deformation during normal use and that has a coefficient of thermal expansion relatively close to that of the integrated circuit and the conductive material that are to be disposed thereover.

Preferably, a nest 14 is formed into one face of body 12 as seen in FIG. 1. Nest 14 may be useful for centering an integrated circuit package over body 12 and at least partially restraining lateral movement of the integrated circuit package. Nest 14 may take the form of a shallow depression or surface that has a lower elevation than the surrounding portions of body 12. A plurality of contact structures 16 are arrayed over a face of body 12 in order to provide a conductive path between the leads of an integrated circuit package and external circuitry. Accordingly, contact structures 16 include a contact surface 18 that is positioned to electrically engage leads when the integrated circuit package is in position over interposer 10. Contact structures 16 are positioned over body 12 so as to have a pitch $P_1$. The pitch of an array of contact structures is defined herein as the distance between a point on one contact structure and the corresponding point on the nearest adjacent contact structure.

Figure 2:
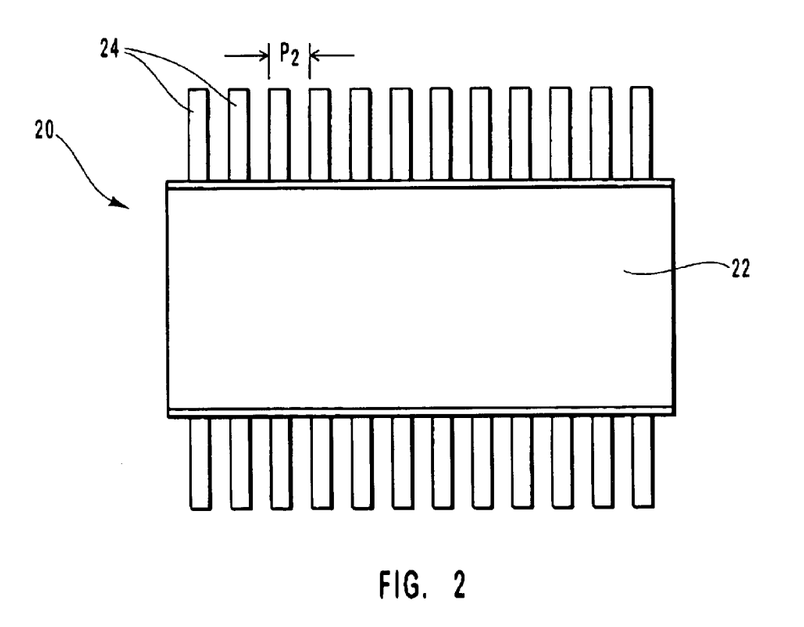
FIG. 2 is a top view of an integrated circuit package having an array of electrical leads that correspond to the array of contact structures of FIG. 1.

FIG. 2 depicts one example of an integrated circuit package 20 that may be used in combination with interposer 10 of FIG. 1. Integrated circuit package 20 includes a body 22 that substantially encases an integrated circuit assembly such as a semiconductor die. Body 22 is constructed of, for example, a resin or polymeric material that insulates the semiconductor die and protects it from environmental conditions. Accordingly, the semiconductor die is not visible in FIG. 2.

The semiconductor die is attached to a lead frame which includes an array of leads 24. The leads 24 emerge from body 22 and are therefore at least partially exposed to the surroundings. Accordingly, leads 24 allow signals or power to be supplied to the internal circuitry of the integrated circuit. As seen in FIG. 2, the leads have a pitch $P_2$ that is defined as the distance between a point on one lead and the corresponding point on the nearest adjacent lead. It can be understood that if the contact surfaces 18 are to be placed in contact with leads 24, pitch $P_1$ of contact structures 16 should be substantially equal pitch $P_2$ of leads 24. Integrated circuit package 20 has leads 24 that emerge from body 22 at two of four edges thereof Other integrated circuit packages are configured differently, and have leads on as few as one edge or as many as all edges thereof.

While the embodiments disclosed herein are generally discussed in reference to their use with integrated circuit packages, it should be understood that the invention extends to any other chip packages and other semiconductor structures that may be temporarily connected to external circuitry. The specific configuration, dimensions, and composition of the semiconductor structures and their accompanying leads are not critical to the invention. Indeed, the interposers of the invention may be adapted for use with substantially any array of leads of a chip package or semiconductor structure.

Figure 3:
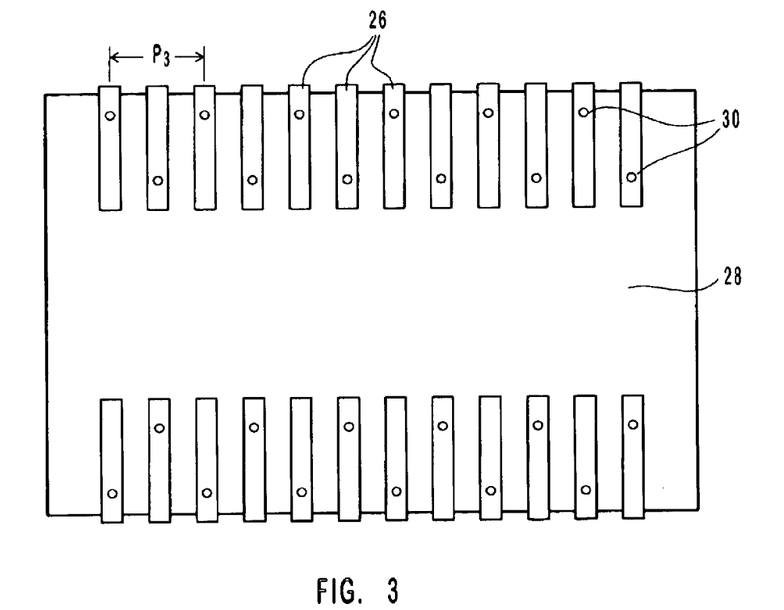
FIG. 3 is a bottom view of the interposer of FIG. 1. An array of terminal contact points are arranged on segments of conductive tape.

FIG. 3 illustrates the interposer 10 of FIG. 1 as viewed from the opposite side as the view of FIG. 1. In this embodiment of the interposer, segments of conductive tape 26 extend from respective contact structures 16 seen in FIG. 1, wrap around the edges of interposer 10, and terminate on bottom face 28 seen in FIG. 3. A terminal contact point 30, which is a site that can be connected to conventional sockets, probes, pins, or the like of a testing device or other external circuitry, is formed on each segment of conductive tape 26.

The terminal contact points 30 are preferably arranged in a staggered formation across bottom face 28. One example of a staggered formation is seen in FIG. 3, and provides that the pitch $P_3$ of terminal contact points 30 is greater than pitch $P_1$ of contact structures 16. Of course, terminal contact points 30 may be arranged on interposer 10 according to patterns other than that depicted in FIG. 3. Staggering the terminal contact points across a face of the interposer or at another location can result in a pitch of the terminal contact points that may be at least two to three times greater than the pitch of the contact structures. Another factor that may contribute to the increase in pitch is that the leads 24 may diverge as seen in FIG. 1 as they extend across body 12 and away from contact surfaces 18.

Figure 4:
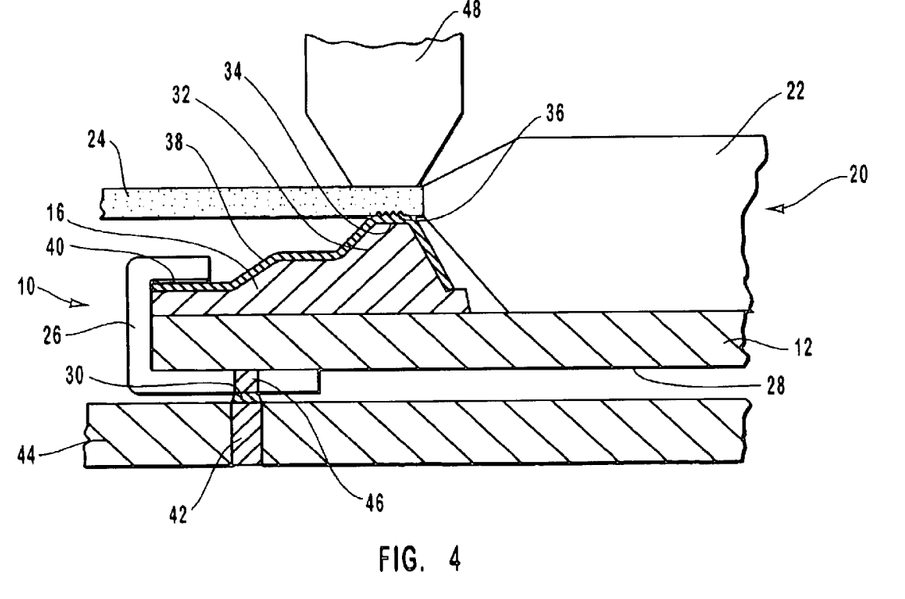
FIG. 4 is a partial cross-sectional elevation view of an electrical contact assembly including an integrated circuit package disposed over the interposer structure of FIG. 1. An electrical lead of the integrated circuit package is placed in electrical communication with external circuitry.

FIG. 4 depicts an electrical contact assembly in which an integrated circuit package is electrically connected to external circuitry using interposer 10 of FIG. 1. Contact structure 16 is formed over body 12 and includes raised member 32 that extends away from body 12. Preferably, raised member 32 is at least partially composed of a dielectric material and projects away from body 12 to terminate at a top surface 34. Accordingly, contact structure 16 is a protruding contact structure. Raised member 32 preferably includes silicon or a silicon containing material and may be formed from the same material as body 12. Indeed, raised member 32 may be integrally formed as a part of body 12. A conductive layer 36 is deposited or otherwise formed over top surface 34 of raised member 32. Accordingly, conductive layer 36 is in a position to electrically engage lead 24 when integrated circuit package 20 is positioned over interposer 10.

Conductive layer 36 includes a conductive material that preferably is durable, has good electrical properties, and can repeatedly make contact with a lead without being significantly worn or eroded. Examples of suitable conductive materials include, but are not limited to, titanium, titanium silicide, beryllium, copper, tungsten, gold, palladium, and alloys or combinations of the foregoing.

A trace 38 preferably extends from conductive layer 36 over a surface of body 12 and/or raised member 32. Trace 38 has an end 40 that is adapted to be connected with a conductive structure such as a wire bonded lead, conductive tape, a non-bonded lead, or the like. Trace 38 may comprise the same conductive material as conductive layer 36 and may simply be an extension of conductive layer 36.

In the example illustrated in FIG. 4, a segment of conductive tape 26 adheres to end 40 of trace 38. Conductive tape 26 wraps around an edge of body 12 and extends to bottom face 28. In this manner, a terminal contact point 30 may be positioned on conductive tape 26 at a location where it may be connected to a probe 42 or another contact pad on testing device 44 or any other compatible contact point on another external circuitry device. Because conductive tape is conventionally composed of a polymeric substrate and a conductive strip formed on one or both faces thereof, a via 46 or another conductive path may need to be formed through or around conductive tape 26 to access the conductive strip.

In the embodiment of FIG. 4 and other embodiments of the invention, the conductive structures that provide a conductive path between the leads of the integrated circuit package and external circuitry are preferably selected to have matched or uniform impedance properties. For example, it is advantageous to use conductive tape 26, traces 38, and conductive layers 36 that have substantially uniform impedance properties when compared one to another. Matched impedance may reduce the noise and other interference that may be otherwise produced during the testing operation, and may further allow reliable transmission of signals between the testing circuitry and the integrated circuit, which becomes more important as higher-speed integrated circuits are used. For the foregoing reasons, conductive tape is particularly useful in the present invention.

Using the contact structures 16 of this embodiment and other embodiments of the invention, electrical connection may be established with leads 24 substantially as near to body 22 as desired. The distance from body 22 at which electrical connections are preferably established is determined by the properties of integrated circuit package 20 and the desired results. However, in many cases, contact can be made with leads 24 as near as a distance of about 25 microns from body 22 using this or other embodiments of the invention. The dimensional precision of the silicon substrate can be plus or minus one (1) micron. Preferably, the determining factor, however, will be the tolerance and variation of the corresponding semiconductor package, which is typically plus or minus two (2) mils (plus or minus fifty (50) microns).

When an integrated circuit package 20 is disposed over interposer 10, there may need to be an apparatus for securing the integrated circuit package 20 in position. In FIG. 4, this is accomplished by means of a clamping apparatus 48 that is brought down on lead 24 on a side thereof opposite conductive layer 36. Alternatively, clamping apparatus 48 may be placed in contact with body 22 or one of any number of other mechanisms may be used to secure integrated circuit package 20 in position. In some cases, adequate electrical contact may be established and maintained without the assistance of a clamping apparatus or other device that performs the same function.

Figure 5:
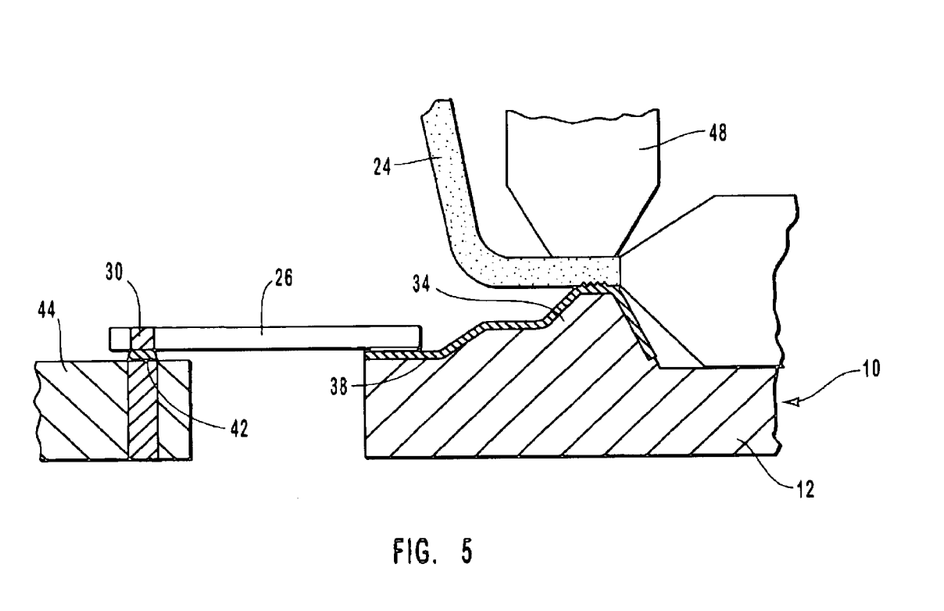
FIG. 5 is a partial cross-sectional elevation view of an alternative configuration of an electrical contact assembly.

FIG. 5 shows an electrical contact assembly similar to that of FIG. 4 wherein the terminal contact points 30 are located at a position separate from the interposer. In this case, terminal contact points 30 are not positioned on bottom face 28 of interposer 10 but are instead located on a distal end of the segment of conductive tape 26. According to the embodiment of FIG. 5, the segments of conductive tape 26 extend away from body 12. This configuration is best used when leads 24 do not remain coplanar with body 12 but instead curve away therefrom, as seen in FIG. 5. This curvature of leads 24 provides clearance in which the segments of conductive tape may fan out away from body 12 instead of being wrapped around the edges thereof. The segments of conductive tape 26 or other conductive structures connected to traces 38 need not be formed as seen in FIG. 5, but instead may extend in substantially any direction as desired. In other respects, the electrical contact assembly of FIG. 5 may be similar to that of FIG. 4. FIG. 5 also illustrates the manner in which raised member 32 may be integrally formed from body 12.

Figure 6:
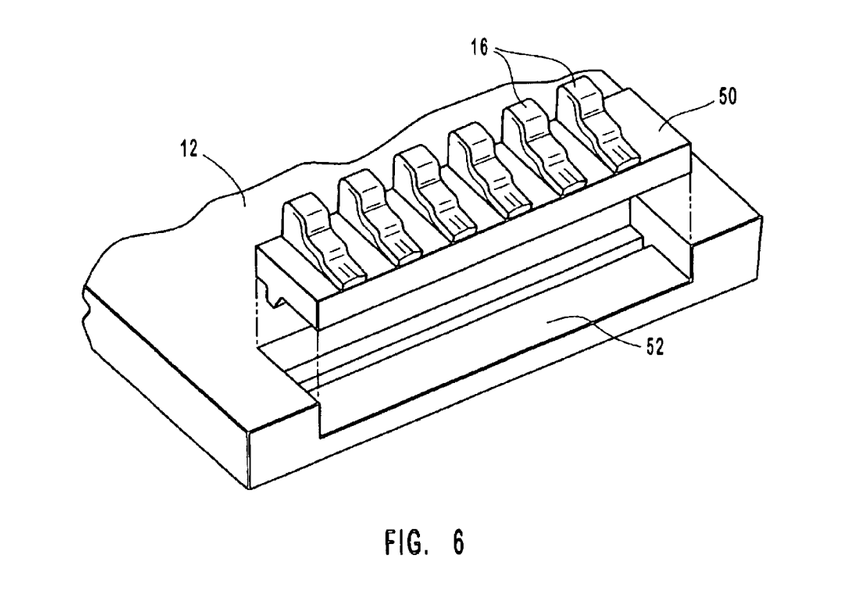
FIG. 6 is an exploded perspective view of a replaceable module that includes a plurality of contact structures and may be fitted onto a substrate of an interposer structure.

As seen in FIG. 6, a group of contact structures 16 may optionally be formed on an insert module 50, which may be removably attached to body 12 of an interposer. For example, insert module 50 supports a plurality of contact structures 16 that are disposed over a surface thereof Insert module 50 may be snap fitted, press fitted, or otherwise removably attached to a mating cavity 52 of body 12. Insert modules 50 may be used so that contact structures 16 may be easily replaced when one or more are damaged, instead of having to replace the entire interposer. If insert modules 50 are used with the interposer, one or more insert modules may be used to contact the leads of each edge of the integrated circuit package.

Figure 7:
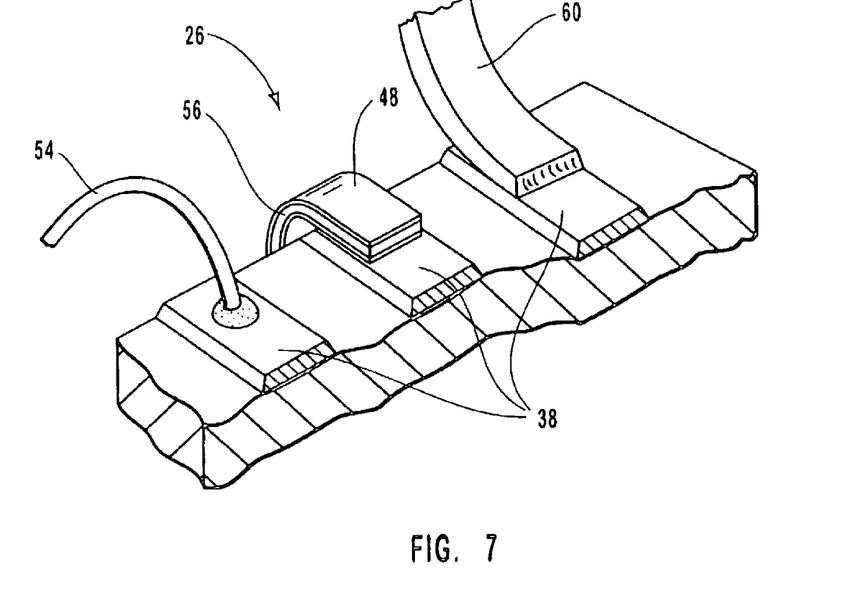
FIG. 7 is a perspective view of alternative conductive structures for electrically connecting traces with external circuitry.

FIG. 7 is a partial perspective view of an edge portion of an interposer structure showing part of several traces 38, and further illustrates three examples of methods for electrically connecting conductive structures to traces 38. While three different conductive structures or conductive members are depicted in FIG. 7, it should be understood that generally only one of these three or another suitable conductive structure is selected for any given interposer. However, three alternate methods are presented here for purposes of illustration.

The first method involves soldering or otherwise permanently bonding a wire-bonded lead 54 to trace 38. In the second method, conductive tape 26 is attached to trace 38. Conductive tape 26 may include a polymeric substrate 56 which may be a polyimide or other suitable material coated on one or both sides by a conductive strip 58. For example, conductive tape 26 may be tape automated bonding (TAB) type conductive tape. Typically, conductive tape 26 is flexible to the extent that it can be bent and wrapped around corners. The third illustrated method involves placing non-bonded lead 60 in contact with trace 38 without forming a permanent bond. In general, the foregoing three examples of conductive structures are understood by persons of ordinary skill in the art. Other means for electrically connecting traces 38 with external circuitry are certainly within the scope of the invention.

Figure 8:
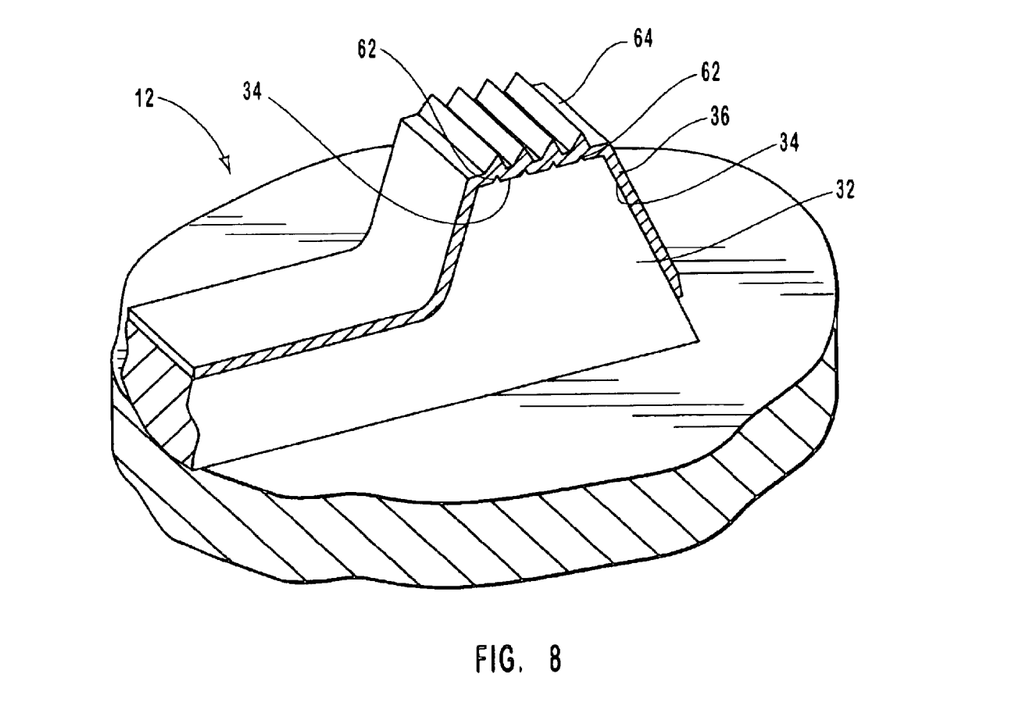
FIG. 8 is perspective view of a contact structure including a raised member and a conductive layer having a plurality of projecting apex structures.

FIG. 8 is an enlarged view of a preferred contact structure 16. In particular, it can be seen that conductive layer 36 is preferably relatively thin compared to the dimensions of raised member 32. Optionally, conductive layer 36 will be formed over one or more projecting apex structures 62 positioned thereon on a contact surface 64 of top surface 34 of raised member 32. Preferably, apex structures 62 are first formed in raised member 32, such as when raised member 32 is integrally formed from body 12, and can be formed by an etching process. Then, conductive layer 36 is evenly deposited over apex structures 62.

When included in contact structure 16, the projecting apex structures 62 facilitate the formation of an ohmic contact with a lead. For example, projecting apex structures 62 may slightly cut into the leads and penetrate any oxide layer that might have been formed thereon. A preferred method for forming projecting apex structures 62 is disclosed in U.S. Pat. No. 5,483,741 issued to Akram et al. which is incorporated herein by reference for purposes of disclosure. Projecting apex structures 62 may also act to securely position an integrated circuit package in place by at least partially restraining lateral motion thereof.

Figure 9:
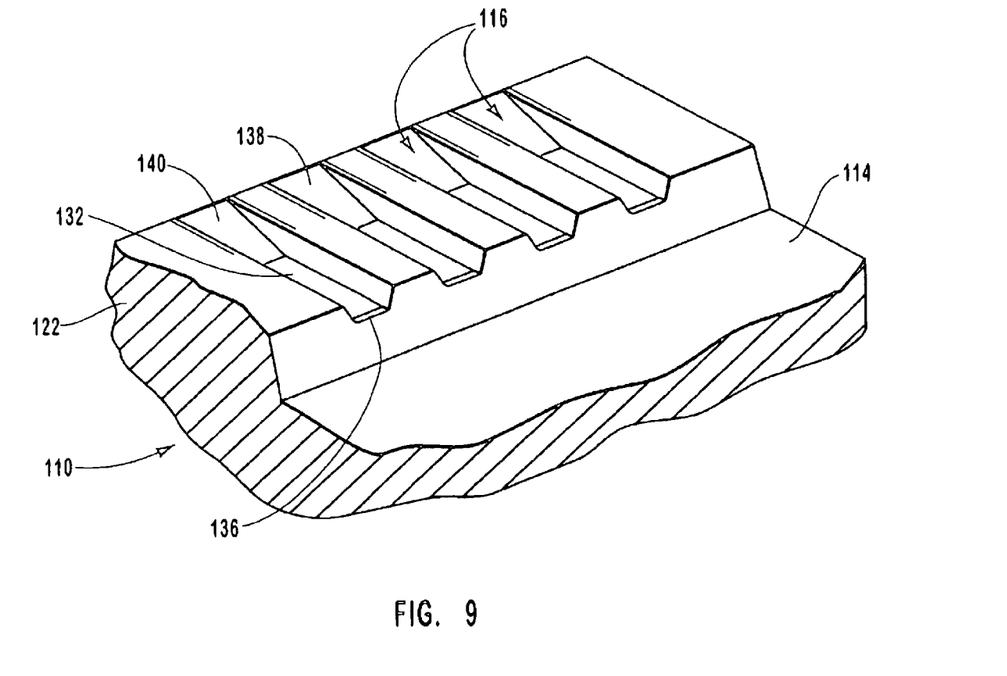
FIG. 9 is a partial perspective view of an interposer structure according to a further embodiment of the invention, wherein the contact structures on the interposer structure include depressions formed into a substrate.

An alternative embodiment of the invention is illustrated in FIG. 9 which is a partial perspective view of an edge portion of an interposer 110. In this embodiment, the contact structures 116 do not include raised members, but instead comprise depressions 132 formed into a substrate by any suitable method. For example, if body 122 consists of silicon or a silicon containing material, depressions 132 may be formed therein by etching or another micromachining operation. Accordingly, contact structures 116 are receding contact structures.

A conductive layer 136 is preferably formed on an inside surface of depression 132. In the embodiment of FIG. 9, this inside surface is substantially coextensive with the bottom of depression 132. A trace 138 preferably extends from conductive layer 136 and has an end 140 that can be connected with conductive structures or other external circuitry. The materials used in conductive layers 136 and traces 138 may be the same as conductive layers 36 and traces 38 of FIG. 4.

While a variety of dimensions and configurations of depression 132 may be used, the primary factor for their selection is the dimensions of the leads that are to be disposed in depressions 132. Typically, depressions 132 have an end that is adjacent to a nest 114 so as to provide an unobstructed opening by which leads may be disposed in depressions 132.

Figure 10:
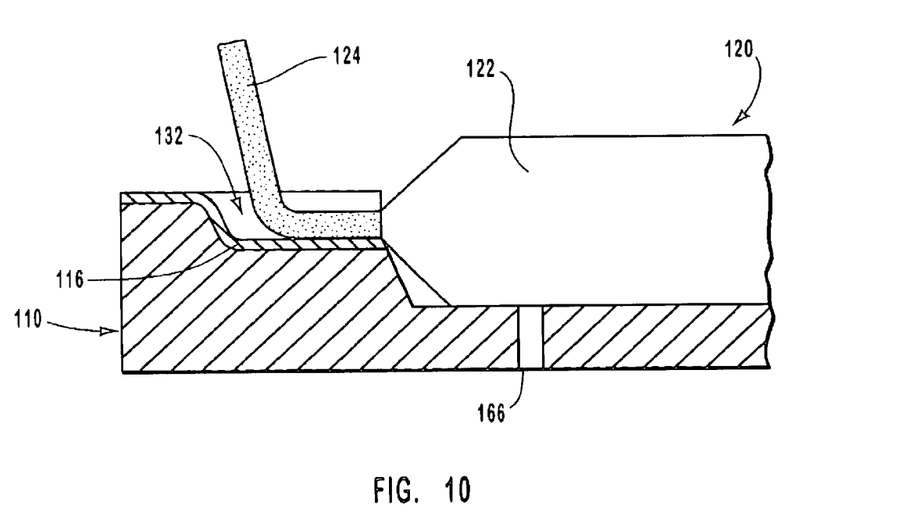
FIG. 10 is a partial cross-sectional elevation view of an electrical contact assembly, including an integrated circuit package electrically connected to the interposer structure of FIG. 9.

FIG. 10 illustrates an electrical contact assembly wherein leads 124 of an integrated circuit package 120 are connected to contact structures 116 of an interposer structure 110. It can be seen that electrical contact may be established with leads 124 at a location thereon as near as desired to body 122 of the integrated circuit package 120. As in the previous embodiment, integrated circuit package 120 is preferably mechanically held in place over interposer 110 such that electrical contact with leads 124 is maintained. Securing integrated circuit package 120 in place may be accomplished by means of a clamping apparatus as depicted in FIG. 4. In this case, a clamping apparatus having an array of castellations that correspond to depressions 132 may need to be used in order to make adequate contact with leads 124. Alternatively, air pressure may be used to hold integrated circuit package 120 in place. As seen in FIG. 10, a vacuum via 166 may be formed through interposer structure 110 to terminate at a surface of body 122. A vacuum source (not shown) may be connected to vacuum via 166, thereby producing reduced pressure therein relative to the ambient air pressure. The resulting vacuum holds integrated circuit package 120 in place over interposer structure 110.

The embodiment of FIGS. 9 and 10 is especially suitable when leads 124 are curved so as to be easily placed within a depression 132. However, depressions 132 may be adjusted in order to receive an array of leads that lie within a plane.

Figure 11:
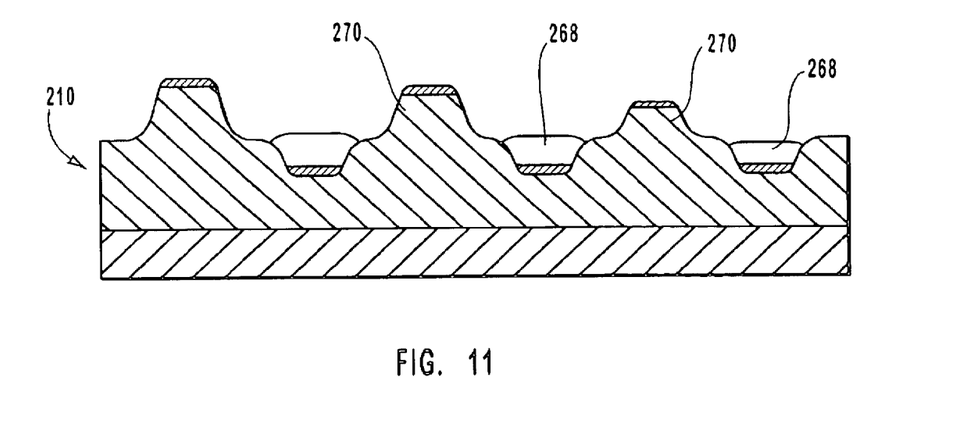
FIG. 11 is a cross-sectional elevation view of an interposer structure having a plurality of contact structures that include both raised members and depressions.

In order to illustrate a further example of the manner in which the contact structures of the invention may be adapted for substantially any chip package, FIG. 11 is a partial cross-sectional elevation view of yet another embodiment of the invention, in which an interposer structure 210 has an array of contact structures, some of which include raised members and some of which include depressions. This arrangement may be used with integrated circuit packages that have two or more sets of leads. For example, some integrated circuits have two lead frames that lie in planes that are displaced one from another. In this case, depressions 268 engage leads in one plane while raised members 270 engage leads in the other plane. In other respects, interposer structure 210 may be substantially similar to interposer structures 10 and 110 disclosed herein. The raised members and depressions of the invention may be adapted as needed to conform to the leads of specific integrated circuit packages and may be provided in any combination on an interposer structure.

Figure 12:
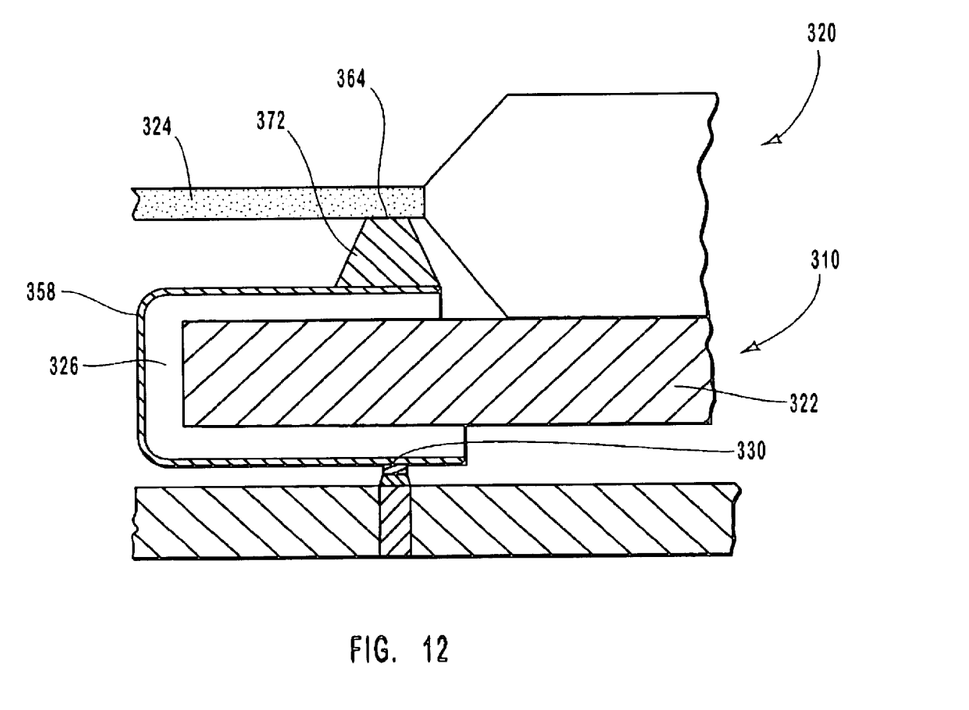
FIG. 12 is a partial cross-sectional elevation view of an electrical contact structure wherein the interposer structure includes a segment of conductive tape and a conductive bump formed on the conductive tape according to another embodiment of the invention.

Yet another embodiment of the invention is depicted in FIG. 12, wherein the contact structures of the previous embodiments are replaced by conductive tape 326 and conductive bumps 372. Conductive tape 326 may be disposed on interposer 310 so that it extends from one face of interposer 310 to the opposite face. Conductive bump 372 is built up over a conductive strip 358 of conductive tape 326 and provides a contact surface 364 that can electrically engage a lead 324. As in other embodiments of the invention, conductive bumps 372 are preferably arrayed over body 322 in a pattern that corresponds to the leads of the particular integrated circuit package that is used. In other respects, the embodiment of FIG. 12 may be substantially similar to the other embodiments disclosed herein, in that electrical contact may be made with a lead substantially as close as desired to the body of an integrated circuit package. Moreover, reliable contact can be made with an integrated circuit package having a very fine pitch. The pitch of terminal contact points 330 may be greater than the pitch of the leads 324 by staggering terminal contact points 330. The material used in conductive bumps 372 may be the same as the material used in the conductive layers disclosed herein.

Any of the foregoing embodiments may be adapted for use with a variety of testing practices and methods. One common testing method already disclosed herein involves bringing an integrated circuit package into contact with the interposers so that testing can be performed. Alternatively, the interposers disclosed herein may be adapted for contacting integrated circuit packages that are held in a tray or another similar collection. In particular, the interposers may be lowered or positioned onto a stationary integrated circuit package while the testing operation is conducted, after which the interposers are lifted away. Still another variation involves providing a hinged assembly including an interposer and an opposable and pivotally attached clamping apparatus. In this method, the integrated circuit package is placed on the interposer and within the hinged assembly, while the clamping apparatus is pivoted onto the integrated circuit package. In view of the foregoing, it should be understood that the interposers may be adapted for use with substantially any testing practice or method.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method of forming an array of contact structures for providing electrical connection to an integrated circuit, said method comprising:

providing a body of rigid dielectric substrate;

forming from said body of rigid dielectric substrate a plurality of raised members, each of said plurality of raised members having a top surface distal to said body of rigid dielectric substrate;

forming a plurality of conductive layers, each of said plurality of conductive layers being formed over at least a portion of the top surface of each of said plurality of raised members, said plurality of raised members being sized and spaced such that said plurality of conductive layers are capable of being removably and electrically engaged with an array of electrical leads of said integrated circuit; and forming one or more projecting apex structures in said portion of the top surface of each of said plurality of raised members, wherein one or more of said plurality of conductive layers are formed on said one or more projecting apex structures.

2. The method as defined in claim 1, wherein forming from said body of rigid dielectric substrate said plurality of raised members comprises conducting an etching operation on said dielectric substrate.

3. The method as defined in claim 1, further comprising establishing electrical connection between said plurality of conductive layers and external circuitry.

4. A method of forming a contact structure for making electrical contact with an electrical lead of an integrated circuit package, the method comprising:

providing a rigid substrate including a dielectric material;

forming a raised member extending away from said substrate and having a top surface distal to said substrate;

forming a conductive layer disposed over at least a portion of said top surface of said raised member, said raised member being sized and positioned such that said conductive layer may electrically engage said electrical lead;

forming an electrical trace disposed over at least a portion of said raised member, said electrical trace being positioned in electrical contact with said conductive layer and being substantially composed of a conductive material so as to provide electrical communication between said conductive layer and external circuitry; and forming a projecting apex structure on at least a portion of the top surface of the raised member, wherein the conductive layer is formed over at least a portion of the projecting apex structure.

5. The method as defined in claim 4, wherein said raised member is integrally formed from said substrate.

6. The method as defined in claim 4, wherein said substrate is substantially composed of a silicon-containing material.

7. The method as defined in claim 4, further comprising electrically connecting a conductive tape to said electrical trace, said conductive tape adapted to place said conductive layer in electrical communication with said external circuitry.

8. The method as defined in claim 4, wherein said conductive layer comprises a material selected from the group consisting of titanium, tungsten, beryllium, copper, gold, palladium, combinations thereof, and alloys thereof.

9. The method as defined in claim 4, further comprising forming projecting structures on said conductive layer for facilitating establishment of electrical engagement between said conductive layer and said electrical lead.

10. A method of forming an array of contact structures for providing electrical connection to an integrated circuit, said method comprising:

providing a dielectric substrate;

forming from said dielectric substrate a plurality of raised members extending away from a body of said dielectric substrate, each of said plurality of raised members having a top surface distal to said body;

forming a plurality of conductive layers, one of said plurality of conductive layers being formed over at least a portion of the top surface of each of said plurality of raised members, said plurality of raised members being sized and spaced such that said plurality of conductive layers are capable of being removably and electrically engaged with an array of electrical leads of the integrated circuit; and forming one or more projecting apex structures in said portion of the top surface of each of said plurality of raised members, wherein one or more of said plurality of conductive layers are formed on said one or more projecting apex structures.

11. A method of forming an array of contact structures for providing electrical connection to an integrated circuit, said method comprising:

providing a rigid substrate comprising a dielectric material;

forming a plurality of rigid raised members on the rigid substrate, each of the plurality of rigid raised members extending away from the rigid substrate and having a top surface distal to the rigid substrate;

forming a conductive layer over at least a portion of each of the top surfaces of each of the plurality of rigid raised members, the plurality of rigid raised members being sized and spaced such that each conductive layer is capable of being removably and electrically engaged with one of an array of electrical leads of the integrated circuit; and forming one or more projecting apex structures in the portion of the top surfaces of each of the plurality of rigid raised members, wherein the conductive layer is formed on the one or more projecting apex structures.

12. The method as defined in claim 11, wherein the rigid substrate and the plurality of rigid raised members are integrally formed.

13. The method as defined in claim 11, further comprising forming an electrical trace disposed over at least a portion of each of the plurality of rigid raised members, each electrical trace being positioned in electrical contact with each conductive layer and being substantially composed of a conductive material so as to provide electrical communication between each conductive layer and external circuitry.

14. The method as defined in claim 13, further comprising electrically connecting a conductive tape to each electrical trace, wherein each conductive tape is adapted to place each conductive layer in electrical communication with the external circuitry.

15. A method of forming a contact structure for making electrical contact with an electrical lead of an integrated circuit package, the method comprising:

providing a rigid substrate comprising a dielectric material;

forming a rigid raised member on the rigid substrate, the rigid raised member extending away from the rigid substrate and having a top surface distal to the rigid substrate;

forming a conductive layer over at least a portion of the top surface of the rigid raised member, the rigid raised member being sized and spaced such that the conductive layer is capable of being removably and electrically engaged with the electrical lead of the integrated circuit package; and forming a projecting apex structure on at least a portion of the top surface of the rigid raised member, wherein the conductive layer is formed over at least a portion of the projecting apex structure.

16. The method as defined in claim 15, wherein the rigid substrate and the rigid raised member are integrally formed.

17. The method as defined in claim 15, further comprising forming an electrical trace disposed over at least a portion of the rigid raised member, the electrical trace being positioned in electrical contact with the conductive layer and being substantially composed of a conductive material so as to provide electrical communication between the conductive layer and external circuitry.

* * * * *

UNITED STATES PATENT AND TRADEMARK OFFICE
CERTIFICATE OF CORRECTION

PATENT NO. : 6,782,613 B1  
DATED : August 31, 2004  
INVENTOR(S) : James M. Wark and Salman Akram It is certified that error appears in the above-identified patent and that said Letters Patent is hereby corrected as shown below:

Title page,  
Item [56], References Cited, U.S. PATENT DOCUMENTS, add the following:  
-- 5,326,412    7/1994    Schreiber et al.  
   5,747,358    5/1998    Gorrell et al.  
   5,950,305    9/1999    Roberts --  
FOREIGN PATENT DOCUMENTS, add the following:  
-- JP    2-52452    2/1990  
   JP    3-198239    8/1991 --  
OTHER PUBLICATIONS, add the following:  
-- Hess C and Weiland LH, *Influence of Short Circuits on Data of Contact & Via Open Circuits Determined by a Novel Weave Test Structure*, IEEE 1995 Intl. Conference on Microelectronic Test Structures, Vol 8, March 1995. --

Column 1,  
Line 57, after "possible to" change "be" to -- the --

Column 6,  
Line 31, before "pitch $P_2$" insert -- to --

Signed and Sealed this

Fourth Day of January, 2005

JON W. DUDAS  
*Director of the United States Patent and Trademark Office*